United States Patent
Olgaard

(10) Patent No.: US 9,485,038 B2
(45) Date of Patent: Nov. 1, 2016

(54) SYSTEM AND METHOD FOR ENABLING AUTOMATED TESTING OF WIRELESS DATA PACKET SIGNAL TRANSCEIVERS

(71) Applicant: LITEPOINT CORPORATION, Sunnyvale, CA (US)

(72) Inventor: Christian Volf Olgaard, Saratoga, CA (US)

(73) Assignee: LitePoint Corporation, Sunnyvale, CA (US)

( * ) Notice: Subject to any disclaimer, the term of this patent is extended or adjusted under 35 U.S.C. 154(b) by 119 days.

(21) Appl. No.: 14/199,607

(22) Filed: Mar. 6, 2014

(65) Prior Publication Data
US 2015/0253357 A1 Sep. 10, 2015

(51) Int. Cl.
*H04B 17/15* (2015.01)
*G01R 31/302* (2006.01)
*H04B 17/00* (2015.01)
*H04B 17/29* (2015.01)
*G01R 31/28* (2006.01)

(52) U.S. Cl.
CPC ........... *H04B 17/15* (2015.01); *G01R 31/3025* (2013.01); *G01R 31/2822* (2013.01); *H04B 17/0085* (2013.01); *H04B 17/29* (2015.01)

(58) Field of Classification Search
None
See application file for complete search history.

(56) References Cited

U.S. PATENT DOCUMENTS

| | | | |
|---|---|---|---|
| 6,163,454 A | 12/2000 | Strickler | |
| 6,377,038 B1 * | 4/2002 | Boswell | H05K 9/0069 174/377 |
| 6,657,214 B1 | 12/2003 | Foegelle et al. | |
| 8,879,659 B1 * | 11/2014 | Olgaard | H04B 17/14 375/267 |
| 2003/0042990 A1 | 3/2003 | Schumacher | |
| 2003/0093187 A1 * | 5/2003 | Walker | B64C 13/20 701/1 |
| 2013/0033279 A1 | 2/2013 | Sozanski | |
| 2013/0257468 A1 | 10/2013 | Mlinarsky | |

OTHER PUBLICATIONS

International Search Report and Written Opinion relative to PCT/US2015/014620, mailed Apr. 28, 2015, 13 pages.

* cited by examiner

*Primary Examiner* — Paresh Patel
(74) *Attorney, Agent, or Firm* — Banner & Witcoff, Ltd.

(57) ABSTRACT

A system and method for enabling automated testing of wireless data packet signal transceiver devices under test (DUTs). One or more DUTs are enclosed inside respective chambers within a shielded enclosure providing electromagnetic shielding for its interior region. Each DUT is powered by an internal power source and its radio frequency (RF) signal port is connected to an external RF signal interface at an outer wall of the shielded enclosure. An anchor at an outer wall of the shielded enclosure enables mechanical engagement with and physical displacement of the shielded enclosure, thereby allowing DUTs to be manipulated using pick and place automation devices for engagement with and connection to automated test equipment. Such test equipment can be assembled into vertically stacked RF signal test stations with which shielded DUT enclosures are engaged by physically mating their respective power and RF signal ports using the pick and place automation device.

10 Claims, 3 Drawing Sheets

SYSTEM AND METHOD FOR ENABLING AUTOMATED TESTING OF WIRELESS DATA PACKET SIGNAL TRANSCEIVERS

BACKGROUND

The present invention relates to testing data packet signal transceivers, and in particular, to automated testing of data packet signal transceiver devices under test (DUTs).

Many of today's electronic devices use wireless signal technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless signal technologies must adhere to various wireless signal technology standard specifications.

When designing such wireless devices, engineers take extra care to ensure that such devices will meet or exceed each of their included wireless signal technology prescribed standard-based specifications. Furthermore, when these devices are later being manufactured in quantity, they are tested to ensure that manufacturing defects will not cause improper operation, including their adherence to the included wireless signal technology standard-based specifications.

For testing these devices following their manufacture and assembly, current wireless device test systems typically employ testing subsystems for providing test signals to each device under test (DUT) and analyzing signals received from each DUT. Some subsystems (often referred to as "testers") include at least a vector signal generator (VSG) for providing the source signals to be transmitted to the DUT, and a vector signal analyzer (VSA) for analyzing signals produced by the DUT. The production of test signals by the VSG and signal analysis performed by the VSA are generally programmable (e.g., through use of an internal programmable controller or an external programmable controller such as a personal computer) so as to allow each to be used for testing a variety of devices for adherence to a variety of wireless signal technology standards with differing frequency ranges, bandwidths and signal modulation characteristics.

As part of the manufacturing of wireless communication devices, one significant component of production cost is costs associated with these manufacturing tests. Typically, there is a direct correlation between the cost of test and the sophistication of the test equipment required to perform the test. Thus, innovations that can preserve test accuracy while minimizing equipment costs (e.g., increasing costs due to increasing sophistication of necessary test equipment, or testers) are important and can provide significant costs savings, particularly in view of the large numbers of such devices being manufactured and tested.

One technique being used to reduce costs and time associated with manufacturing test is to test multiple DUTs concurrently by assembling and connecting one or more testers with additional signal routing circuitry (e.g., signal dividers, combiners, switches, multiplexors, etc.) as needed for providing receive (RX) signals to the DUTs and for receiving and analyzing transmit (TX) signals produced by the DUTs. In such a manufacturing test environment, the testers and DUTs will all be emitting radio frequency (RF) signals, often concurrently, thereby resulting in significant likelihood of signal interference. For example, a signal from the tester intended for one DUT may be erroneously received and acted upon by another DUT. Alternatively, signals generated by multiple DUTs may interfere with one another, as well as cause the tester to erroneously identify such signals as valid or invalid when, in fact, the opposite is true, notwithstanding the use of various signal shielding mechanisms to keep such signals mutually isolated.

With many such wireless communication devices being manufactured at the rate of millions of units per month, the demand increases for faster, more efficient and lower-cost testing systems and techniques. Factories designed to build millions of devices per month, which is where most manufacturing test is performed, have testing floors filled with test systems, conveyor systems and personnel constantly connecting and disconnecting devices as they move among the various test stations. The focus of these testing environments has, so far, been placed on optimizing use of horizontal floor space so that larger numbers of devices can flow through a test area per unit time. However, while this optimization has been focused on the horizontal dimensions, e.g., the "X" and "Y" dimensions, focus on the vertical, or "Z" dimension, has been noticeably absent.

Streamlining of testing has been further impeded by the need to continually connect and disconnect the DUTs to successive test systems and fixtures as they progress through the testing regimen. As a result, the likelihood of damage occurring to the small and often fragile connectors increases with the number of connections and disconnections. This, in turn, adds to the numbers of DUTs that are ultimately identified as failures and then reworked or discarded.

Accordingly, it would be desirable to have improved systems and methods for testing multiple DUTs while avoiding test-induced failures due to connector failures, and optimizing the physical testing environment.

SUMMARY

In accordance with the presently claimed invention, a system and method are provided for enabling automated testing of wireless data packet signal transceiver devices under test (DUTs). One or more DUTs are enclosed inside respective chambers within a shielded enclosure providing electromagnetic shielding for its interior region. Each DUT is powered by an internal power source and its radio frequency (RF) signal port is connected to an external RF signal interface at an outer wall of the shielded enclosure. An anchor at an outer wall of the shielded enclosure enables mechanical engagement with and physical displacement of the shielded enclosure, thereby allowing DUTs to be manipulated using pick and place automation devices for engagement with and connection to automated test equipment. Such test equipment can be assembled into vertically stacked RF signal test stations with which shielded DUT enclosures are engaged by physically mating their respective power and RF signal ports using the pick and place automation device.

In accordance with one embodiment of the presently claimed invention, a system for enabling automated testing of one or more wireless data packet signal transceiver devices under test (DUTs) includes:

a shielded enclosure with an interior region containing one or more interior chambers and defined by a plurality of outer walls providing electromagnetic shielding for the interior region, wherein one or more of the plurality of outer walls include an external power connection for conveying external electrical power, an external radio frequency (RF) signal interface for conveying one or more RF signals for and from one or more DUTs, and an anchor for enabling mechanical engagement with and physical displacement of the shielded enclosure;

a power source disposed within the shielded enclosure, coupled to the external power connection and responsive to the external electrical power by providing internal electrical power for said one or more DUTs;

one or more conductive electrical power paths disposed within the shielded enclosure, coupled to the power source and extending to respective ones of the one or more interior chambers for conveying the internal electrical power; and one or more conductive RF signal paths disposed within the shielded enclosure, coupled to the external RF signal interface and extending to respective ones of the one or more interior chambers.

In accordance with another embodiment of the presently claimed invention, a method of enabling automated testing of one or more wireless data packet signal transceiver devices under test (DUTs) includes:

enclosing each one of one or more DUTs inside a respective one of one or more interior chambers contained within an interior region of a shielded enclosure defined by a plurality of outer walls providing electromagnetic shielding for the interior region;

connecting a power port of each one the one or more DUTs to a power source that is disposed within the shielded enclosure and connected to an external power connection at one of the plurality of outer walls of the shielded enclosure;

connecting a radio frequency (RF) signal port of each one the one or more DUTs to an external RF signal interface at one of the plurality of outer walls of the shielded enclosure; and mechanically engaging an anchor at one of the plurality of outer walls of the shielded enclosure and physically displacing the shielded enclosure.

DETAILED DESCRIPTION

Figure 1:
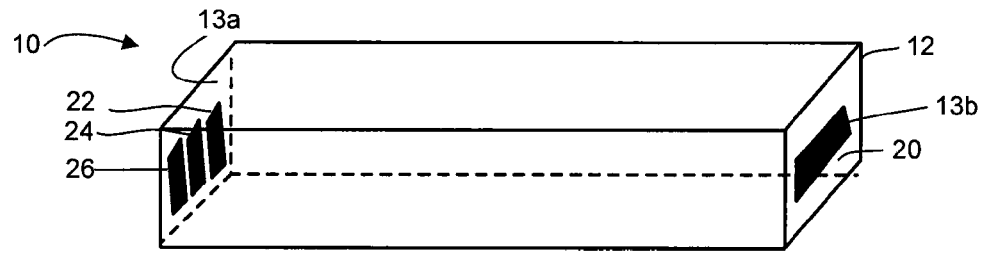
FIG. 1 depicts a perspective view of a testing enclosure in accordance with exemplary embodiments of the presently claimed invention.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Wireless devices, such as cellphones, smartphones, tablets, etc., make use of standards-based technologies, such as IEEE 802.11a/b/g/n/ac, 3GPP LTE, and Bluetooth. The standards that underlie these technologies are designed to provide reliable wireless connectivity and/or communications. The standards prescribe physical and higher-level specifications generally designed to be energy-efficient and to minimize interference among devices using the same or other technologies that are adjacent to or share the wireless spectrum.

Tests prescribed by these standards are meant to ensure that such devices are designed to conform to the standard-prescribed specifications, and that manufactured devices continue to conform to those prescribed specifications. Most devices are transceivers, containing at least one or more receivers and transmitters. Thus, the tests are intended to confirm whether the receivers and transmitters both conform. Tests of the receiver or receivers (RX tests) of a DUT typically involve a test system (tester) sending test packets to the receiver(s) and some way of determining how the DUT receiver(s) respond to those test packets. Transmitters of a DUT are tested by having them send packets to the test system, which then evaluates the physical characteristics of the signals sent by the DUT.

In general, testing of wireless devices is preceded by the connecting of those devices to their respective test subsystem or system using conductive signal connectors. Following completion of an intended round of tests, each DUT is disconnected from its respective test subsystem or system, following which each DUT is connected to another test subsystem or system via the same conductive signal connectors, with further disconnections and connections repeated for each successive test subsystem or system used thereafter.

Factories operative to test large numbers of DUTs in continuous fashion will have test systems and conveyor systems arranged in ways that aim at minimizing inter-test-station travel and both extraneous and inter-DUT interference. Such arrangements are typically set up to optimize the use of the horizontal-plane area (e.g., floor space).

Test stations in such high-volume manufacturing and testing facilities may use multiple DUT fixtures associated with each test station, and these fixtures remain in fixed positions relative to those test stations. Thus, the DUTs, themselves, are conveyed from test station to test station and repeatedly connected to and disconnected from a succession of fixed-position fixtures often including plugging and unplugging cables and connectors for conveying signals between the DUTs and testers during test. In addition, the DUTs as they are moved from station to station often require repeated power up and initialization steps, which take time but produce little or no useful test results during that time.

As discussed in more detail below, systems and methods in accordance with exemplary embodiments of the presently claimed invention provide for and use shielded test enclosures for reducing instances of connecting and disconnecting multiple DUTs to avoid potentially damaging multiple connections and disconnections to the DUT connectors, while also enabling use of vertical space in a testing facility as part of a modular automated test system. As a result, handling of, frequent connection to and disconnection from the DUTs is shifted from individual DUTs to groups of DUTs via larger and more mechanically robust connectors. This allows the number of DUTs that can be tested within a facility to be increased, while reducing damage caused by frequent connection and disconnection of DUTs as they progress through a testing regimen.

Referring to FIG. 1, one part of a system in accordance with exemplary embodiments is a shielded box fixture 10, which includes a rectangular shaped box 12 and a suitable lid or cover (not shown). The box 12 and cover have dimensions chosen based upon the range of sizes of DUTs (not shown) to be placed inside (or to accommodate a single DUT, as desired), along with the sizes and positions of a DUT power source and control circuitry (discussed in more detail below). The box 12 and cover are fabricated using a material that provides strength, rigidity and electromagnetic shielding for the interior region when the cover is affixed in its place. The lid may be augmented by conductive wiper structures such that when the lid is placed on the shield box there is continuous electrical conductivity across the inner surfaces of the lid and box 12. Additionally, the DUTs are separated by shielding baffles, e.g., thereby creating interior shielded chambers, that effectively electromagnetically isolate each DUT from one another. These baffles, or chambers, would also be part of the continuous electrical conductivity across the inner surfaces of the lid and box 12.

One side 13a of the box 12 will have one or more signal interface structures that include (without limitation) a radio frequency (RF) signal interface 22, a power interface 24 and a control signal interface 26 (discussed in more detail below). These interfaces 22, 24, 26 are in the form of docking signal connections between the box 12 and an associated tester (not shown). Another side 13b, e.g., opposite the first side 13a, includes an anchoring structure 20 that enables engagement with a robotic positioning system (not shown). As discussed in more detail below, when the DUTs within the shield affixture 10 are connected to the RF interface 22 and internal power source and control circuitry (not shown) the DUTs can be powered up and initialized, thereby making them ready to begin active testing once the shield fixture 10 has been docked with a tester (not shown).

Figure 2:
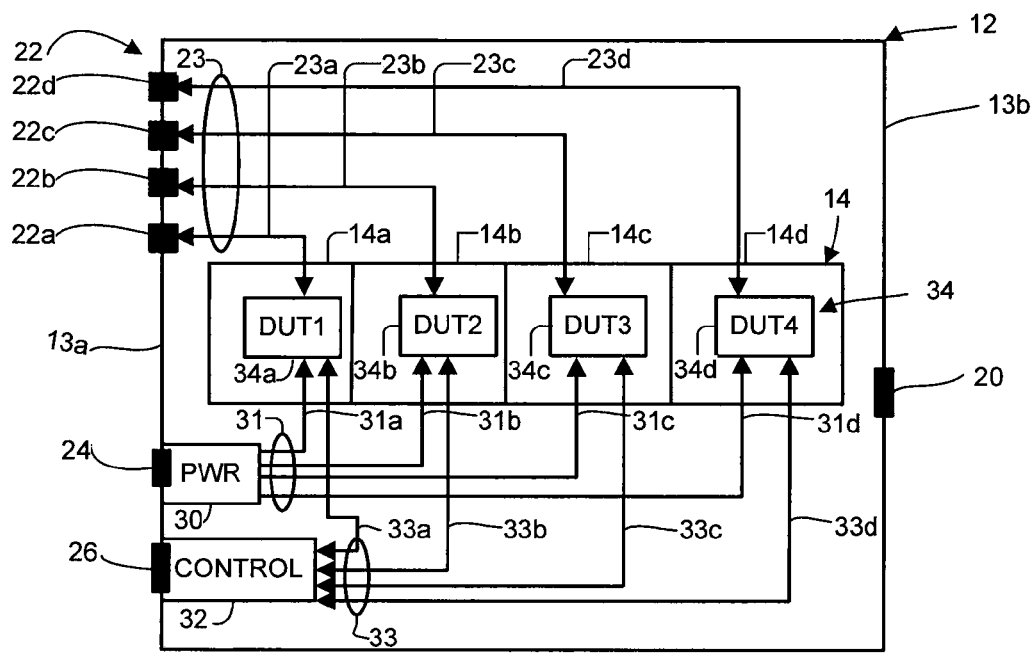
FIG. 2 depicts a schematic view of a populated testing enclosure in accordance with exemplary embodiments of the presently claimed invention.

Referring to FIG. 2, in accordance with exemplary embodiments, a populated shielded test fixture 10 includes an interior region with internal compartments 14 to enclose and shield the DUTs 34 (e.g., four compartments 14 and DUTs 34 for purposes of this example, though it will be understood that the number of compartments and DUTs can be scaled higher or lower to a single DUT, as desired). The DUTs 34 communicate with the RF signal interface 22 via respective conductive RF signal paths 23 (e.g., coaxial cables and connectors). Prior to engaging the test fixture 10 with a tester (not shown), the individual DUTs 34a, 34b, 34c, 34d are placed in their respective shielded chambers 14a, 14b, 14c, 14d and connected to their RF signal paths 23a, 23b, 23c, 23d, power connections 31a, 31b, 31c, 31d, and control signal connections 33a, 33b, 33c, 33d (e.g., multiple-conductor signal cables). Power for the DUTs is provided by an internal power source 30 (e.g., a rechargeable battery that can be recharged when the power interface 24 engages a power port (e.g., on the tester), and conveyed to the DUTs 34 via their power connections 31. Control for the DUTs 34 is provided by internal control circuitry 32, which exchanges control instructions and data with the DUTs 34 via their control signal interfaces 33, and exchanges control information with the tester via the control signal interface 26. Alternatively, the internal control circuitry 32 can be omitted and control provided from the tester via the control signal connections 33.

Figure 3:
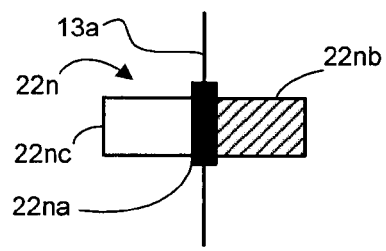
FIG. 3 depicts a cross-sectional view of a feed-through radio frequency (RF) connection.

Referring to FIG. 3, in accordance with well-known techniques, the RF signal interface 22 can be implemented using a feed-through RF signal connector 22n attached to the wall 13a of the box 12 (e.g., using threaded fasteners). Such a connector 22n includes a connector body 22na having an internal threaded female coaxial port 22nb and an external coaxial port 22nc adapted for push-on and pull-off connectivity.

Similarly, the power interface 24 and control signal interface 26 can be implemented using well known plug and socket connectors.

Figure 4:
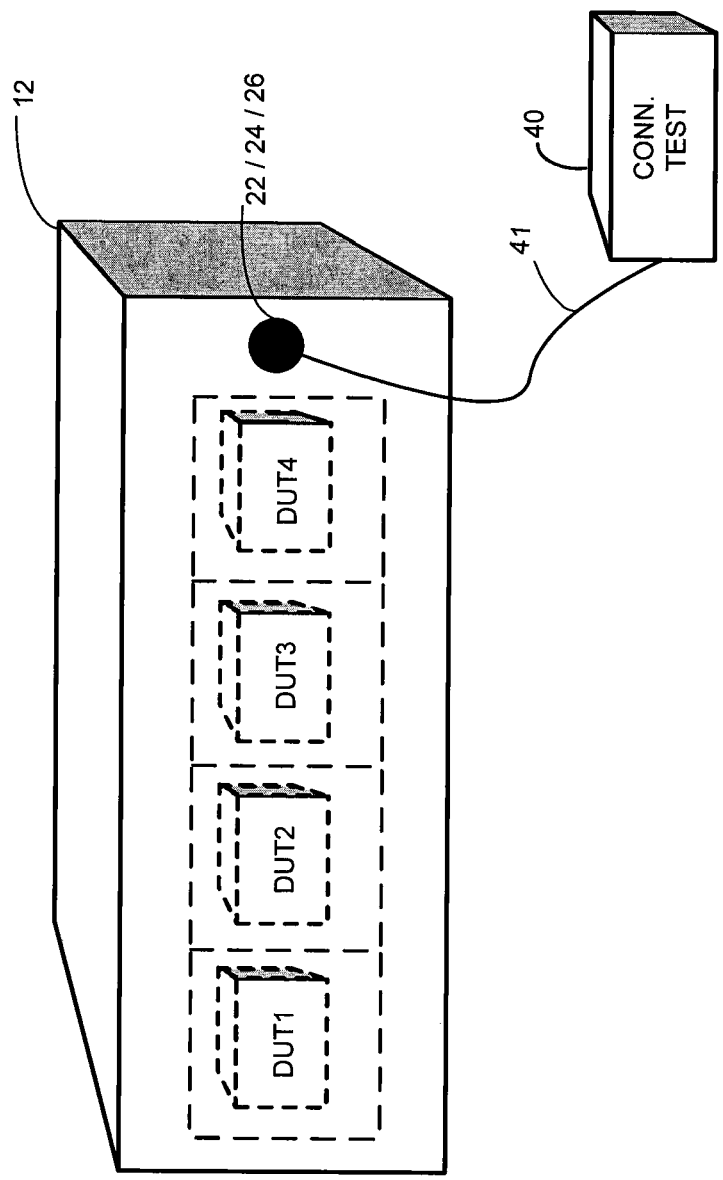
FIG. 4 depicts a schematic view of a populated testing enclosure undergoing a connectivity test in accordance with exemplary embodiments of the presently claimed invention.

Referring to FIG. 4, prior to placing the test fixture 10 into a testing queue, it may be desirable to first test for proper connectivity to ensure that all internal power and signal connections 23, 31, 33 have been properly made. For example, a connectivity test device 40 (e.g., a test instrument capable of testing for voltage, current, resistance, or impedance) can be connected via one or more electrical cables 41 to the signal interfaces 22, 24, 26 and perform conventional connectivity testing. Such testing can include conductivity testing, e.g., for the power source 30 and control signal interface 32, as well as impedance testing (e.g., as described in U.S. patent application Ser. Nos. 13/791,098 and 13/791,127, the disclosures of which are incorporated herein by reference).

Figure 5:
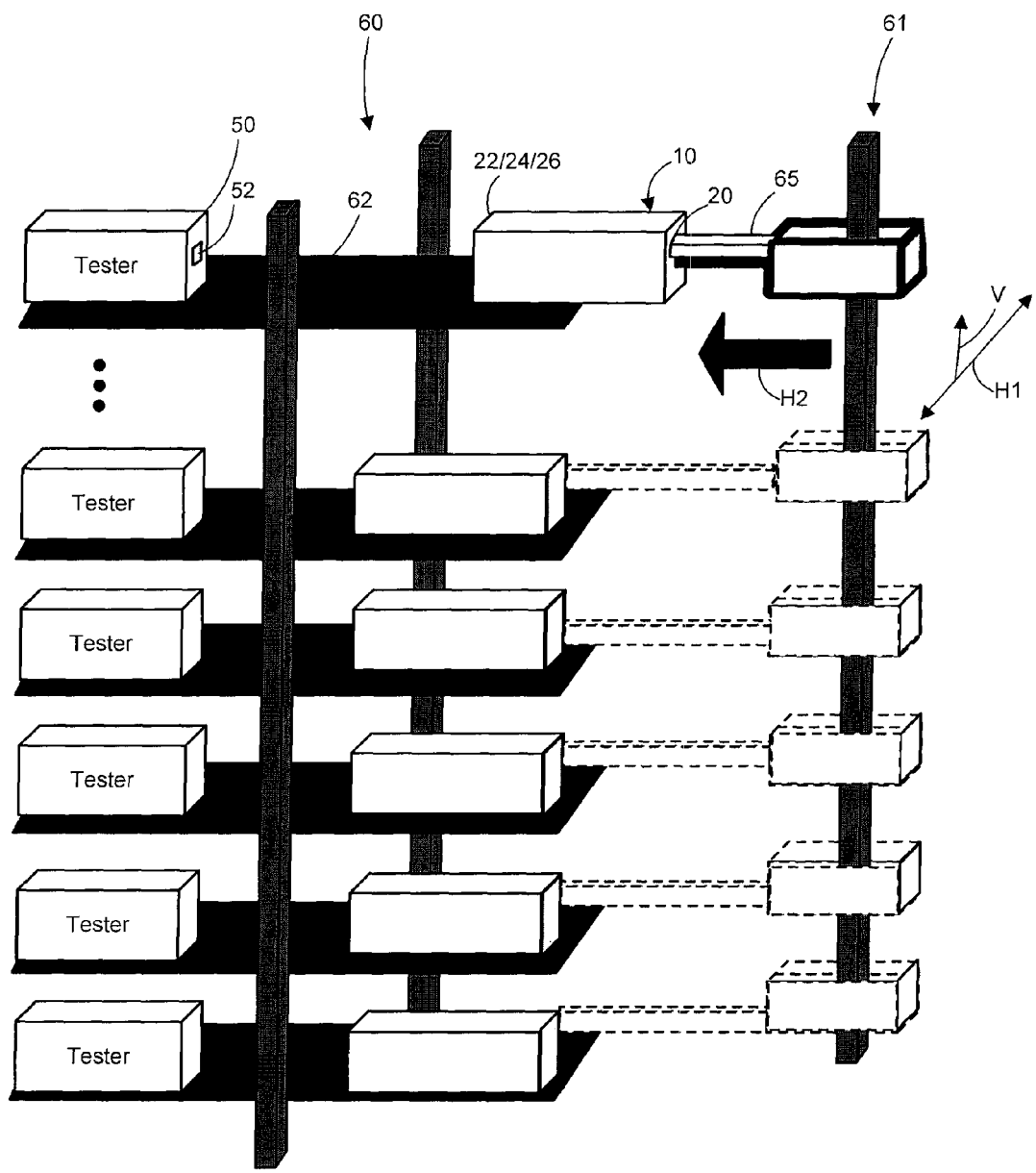
FIG. 5 depicts an automated testing system for stacking testing stations in accordance with exemplary embodiments of the presently claimed invention.

Referring to FIG. 5, in accordance with exemplary embodiments, multiple shielded test fixtures 10, as discussed above, can be used in an automated testing system 60 in which multiple test stations are arranged vertically to maximize use of available vertical space and minimize use of available horizontal space, as discussed above. Each test station includes a platform, or shelf, 62 on which the shielded test fixture 10 is placed by a robotic positioning system 61 using a mechanical arm 65 that engages the anchor 20 (FIG. 1). By appropriately displacing each test fixture 10, e.g., elevating the test fixture 10 to and sliding it along the platform 62 in a horizontal direction H2 toward the associated tester 50, the signal interfaces 22, 24, 26 of the test fixture 10 engage one or more compatible signal interfaces 52 of the tester 50. (Alternatively, multiple shielded test fixtures 10 can be placed and displaced and engaged with the tester 50, thereby providing for shared uses of the tester 50 for testing more DUTs.) This process can be repeated for other platforms 62 within the test system 60, as well as other platforms within other test systems as the robotic positioning system 61 moves along another horizontal direction H1 displacing, or positioning, additional test fixtures 10 on other platforms 62 along the vertical direction V.

Based upon the foregoing discussion, it can be seen that testing systems and methods in accordance with the presently claimed invention offer a number of advantages. By locating multiple DUTs within the shielded test fixture, instances of connecting and disconnecting individual DUTs can be minimized, thereby reducing chances of damaged connectors. With the shielded test fixture being larger than a DUT, its connectors can be larger and more robust than the miniaturized connectors on the DUT, and since it is these connectors that are frequently connected and disconnected, need for their replacement or repair will also be infrequent. Additionally, having an internal power source and control circuitry allow the installed DUTs to be powered up and initialized so as to be ready for testing upon insertion of the shielded test fixture into a testing station with its associated tester. Further, by using a rechargeable power source, such as a rechargeable battery, need for replacement of such power source will be infrequent. Hence, such a shielded test fixture in combination with a stacking test station structure and robot positioning provides a three-dimensional testing environment able to accommodate more DUTs concurrently than a typical horizontally, or planar, arranged testing environment. This reduces the amount of space required and its associated costs. Further, unlike fixed test fixtures, the shielded test fixture can be moved among various test stations until the full course of testing has been completed.

Additionally, robotic systems can place items such as these shielded DUT enclosures up higher than a person can reach, thereby allowing more of the test facility spatial volume to be utilized for testing purposes. Also, multiple DUTs in multiple shielded enclosures can be connected to a single tester, thereby obtaining even greater degrees of concurrent DUT testing and tester resource sharing. Further, such shielded enclosures can be provided with connector interfaces which are more durable, to accommodate the robotic handling, as compared to the smaller and more fragile connectors typically provided on the DUTs.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a system for enabling automated testing of one or more wireless data packet signal transceiver devices under test (DUTs), including automated placement within a testing environment, comprising:
    a shielded enclosure with an interior region containing one or more interior chambers and defined by a plurality of outer walls providing electromagnetic shielding for said interior region, wherein one or more of said plurality of outer walls include
        an external power connection for conveying external electrical power,
        an external radio frequency (RF) signal interface for conveying one or more RF signals for and from one or more DUTs, and
        an anchor for enabling mechanical engagement with and physical displacement of said shielded enclosure;
    a power source disposed within said shielded enclosure, coupled to said external power connection and responsive to said external electrical power by providing internal electrical power for said one or more DUTs;
    one or more conductive electrical power paths disposed within said shielded enclosure, coupled to said power source and extending to respective ones of said one or more interior chambers for conveying said internal electrical power; and
    one or more conductive RF signal paths disposed within said shielded enclosure, coupled to said external RF signal interface and extending to respective ones of said one or more interior chambers.

2. The apparatus of claim 1, wherein said one or more interior chambers comprises a plurality of interior chambers mutually shielded to substantially inhibit electromagnetic radiation originating in one chamber from being received in another chamber.

3. The apparatus of claim 1, wherein said one or more interior chambers comprises a plurality of interior chambers each one of which includes at least one wall with:
    an internal power connection coupled to one of said plurality of conductive electrical power paths for conveying a portion of said internal electrical power to one of said plurality of DUTs; and
    an internal RF signal interface coupled to one of said plurality of conductive RF signal paths for conveying at least one of said one or more RF signals from said one of said plurality of DUTs.

4. The apparatus of claim 1, wherein said one or more of said plurality of outer walls further include an external control signal interface for conveying one or more external control signals, and further comprising:
    control circuitry disposed within said shielded enclosure, coupled to said external control signal interface and responsive to at least a portion of said one or more external control signals by providing one or more internal control signals for said one or more DUTs; and
    one or more conductive control signal paths disposed within said shielded enclosure, coupled to said control circuitry and extending to respective ones of said one or more interior chambers for conveying said one or more internal control signals.

5. The apparatus of claim 4, wherein said one or more interior chambers comprises a plurality of interior chambers each one of which includes at least one wall with:
    an internal power connection coupled to one of said plurality of conductive electrical power paths for conveying a portion of said internal electrical power to one of said plurality of DUTs;
    an internal RF signal interface coupled to one of said plurality of conductive RF signal paths for conveying at least one of said one or more RF signals from said one of said plurality of DUTs; and
    an internal control signal interface coupled to one of said plurality of conductive control signal paths for conveying at least one of said one or more internal control signals to said one of said plurality of DUTs.

6. The apparatus of claim 1, wherein said anchor is for enabling three-dimensional physical displacement of said shielded enclosure.

7. The apparatus of claim 1, further comprising a shelving structure including a plurality of shelves, wherein each one of said plurality of shelves accommodates at least one said shielded enclosure.

8. The apparatus of claim 7, further comprising a plurality of testers, wherein each one of said plurality of shelves further accommodates at least one of said plurality of testers and each one of said plurality of testers is disposed on a respective one of said plurality of shelves.

9. The apparatus of claim 8, wherein each one of said plurality of testers includes at least one signal interface configured to connect with said external RF signal interface.

10. The apparatus of claim 7, wherein said plurality of shelves is arranged as a vertical column of shelves above and below each other.

\* \* \* \* \*